United States Patent
Baldwin

(10) Patent No.: US 6,777,818 B2
(45) Date of Patent: Aug. 17, 2004

(54) MECHANICAL SUPPORT SYSTEM FOR A THIN PACKAGE

(75) Inventor: Chris Baldwin, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/045,315

(22) Filed: Oct. 24, 2001

(65) Prior Publication Data

US 2003/0075787 A1 Apr. 24, 2003

(51) Int. Cl.⁷ .......................... H01L 23/29; H01L 23/48
(52) U.S. Cl. ...................... 257/795; 257/692; 257/724; 257/789
(58) Field of Search ............................... 257/692, 698, 257/723, 724, 787–795

(56) References Cited

U.S. PATENT DOCUMENTS

| 5,570,274 A | * | 10/1996 | Saito et al. ................ 361/784 |
| 6,400,033 B1 | * | 6/2002 | Darveaux .................. 257/778 |
| 6,452,113 B2 | * | 9/2002 | Dibene, II et al. .......... 174/260 |

* cited by examiner

*Primary Examiner*—Ori Nadav
(74) *Attorney, Agent, or Firm*—Schwegman, Lundberg, Woessner & Kluth, P.A.

(57) ABSTRACT

An electronic package includes an IC, such as a die, mounted onto one side of a thin interposer and a pin carrier mounted to an opposing side of the interposer. The pin carrier includes a cavity underneath the die. The cavity allows capacitors, or other electronic components, to be mounted against the interposer beneath the die. The cavity in the pin carrier is filled with an encapsulant to mechanically support the thin interposer in the area of the cavity during operation of an electronic system that includes the package.

13 Claims, 2 Drawing Sheets

MECHANICAL SUPPORT SYSTEM FOR A THIN PACKAGE

TECHNICAL FIELD OF THE INVENTION

The present invention relates generally to electronics packaging. More particularly, the present invention relates to an electronic package that includes a die packaged on a thin interposer, and to manufacturing methods related thereto.

BACKGROUND OF THE INVENTION

Integrated circuits (ICs) have typically been assembled into electronic packages by physically and electrically coupling them to a substrate made of organic or ceramic material. One or more such IC packages can be physically and electrically coupled to a secondary substrate such as a printed circuit board (PCB) or motherboard to form an electronic assembly. The electronic assembly can be part of an electronic system. An electronic system is broadly defined herein as any product comprising an electronic assembly. Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

Manufacturers of electronic systems constantly try to improve product performance while reducing production costs. This is particularly true regarding the packaging of ICs, where each new generation of packaging must provide increased performance while generally being smaller or more compact in size. Therefore, manufacturers of high-end ICs, such as processors, continually develop IC packages that are thinner, lighter-weight, and/or more resilient because such packaging is useful for many applications.

A typical package includes an IC, such as a die, that is mounted on an interposer which functionally connects the die through a hierarchy of electrically conductive paths to the other elements, such as other ICs, that make up the electronic system. Surface mount technology (SMT) is a widely known technique for coupling a die to an interposer. One of the conventional methods for surface-mounting an IC on an interposer is called "controlled collapse chip connect" (C4). In fabricating a C4 joint, the electrically conductive terminals or lands of an IC component are soldered directly to corresponding lands on the surface of the interposer using reflowable solder bumps or balls. The C4 process is widely used because of its robustness and simplicity.

The C4 joints are often used in combination with an underfill, such as an epoxy. The epoxy helps to hold the joint together when there is thermal expansion and contraction of the package during operation of the integrated circuit.

Power delivery is an area of microprocessor development that will be crucial to improving future microprocessors. One of the major limitations associated with power delivery is the inductive path, or loop, between a die and one or more capacitors that provide power to the components in the die before another source, such as a voltage regulator, is able to provide a steady supply of power. This limitation is typically addressed by attaching the capacitors to the underside of a thin interposer that is positioned between the die and the capacitors in order to minimize the distance between the die and the capacitors. Reducing the distance between the capacitors and the die minimizes the inductive loop that is generated when supplying a voltage to the die. However, the thin interposer leads to another problem as the thin interposer is unable to handle the mechanical loads that are applied by the heat sinks which are typically used to cool the integrated circuit.

FIGS. 1 and 2 show two different types of prior art packages. The package 10 illustrated in FIG. 1 includes a die 12 that is mounted onto an interposer 14 using a conventional C4 joint that is supplemented by a conventional underfill 15. A pin carrier 16 is attached to the underside of the interposer 14 to support the interposer 14 along at least the entire area of the die 12. The design of the package 10, in particular the pin carrier 16, does not permit capacitors, or any other electronic component, to be mounted to the underside of the interposer 14 in that area of the interposer which is opposite to the die 12. Therefore, the prior art package 10 shown in FIG. 1 suffers from an inductive path problem.

FIG. 2 shows a prior art package 20 that overcomes the inductive path problem. The package 20 includes a die 22 that is mounted onto a thin interposer 24. The die 22 is similarly mounted to the interposer 24 using a conventional C4 joint that is supplemented by a conventional underfill 25. A pin carrier 26 that includes a cavity 27 is mounted to the underside of the thin interposer 24. The cavity 27 in the pin carrier 26 is positioned underneath the die 22 such that capacitors 28 may be mounted to the underside of the interposer 24 opposite to the die 22 using conventional surface mount technology. Placing the capacitors 28 against the interposer 24 within the cavity 27 of the pin carrier 26 reduces the distance between the die 22 and capacitors 28. This reduced distance minimizes the inductive loop problem. However, the thin interposer 24 is incapable of withstanding the mechanical load that is applied to the package 20 by heat sinks and other thermal elements within the integrated circuit during operation of the electronic system where the package 20 is located. The mechanical load generates package deflection that results in multiple failure modes, including internal damage to the package circuitry and/or damage to the capacitor joints.

As the internal circuitry of processors operates at higher and higher clock frequencies, and as processors operate at higher and higher power levels, the amount of loop inductance produced within processor packages often increases to unacceptable levels. Therefore, there is a significant need for a reliable electronics package, and methods of fabricating an electronics package, that generates minimal loop inductance within the package yet is mechanically stable.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that mechanical, chemical, structural, electrical, and procedural changes may be made without departing from the spirit and scope of the present invention. The following detailed description is, therefore, not to be taken in a limiting sense, and the scope of the present invention is defined only by the appended claims.

Figure 1:
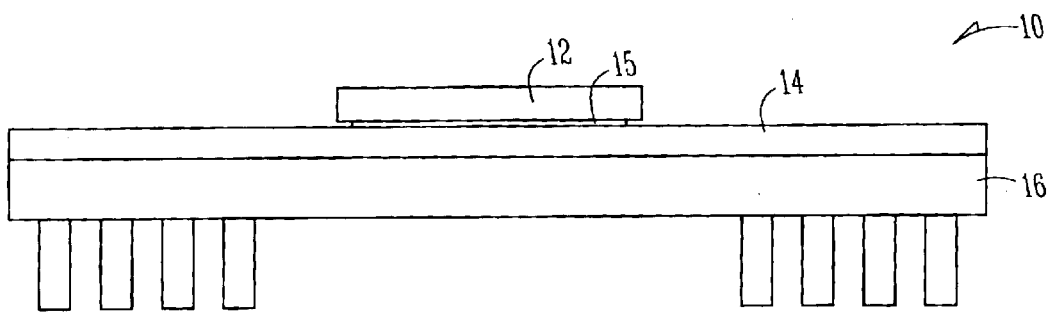
FIG. 1 is a simplified diagram illustrating a prior art package.
Figure 2:
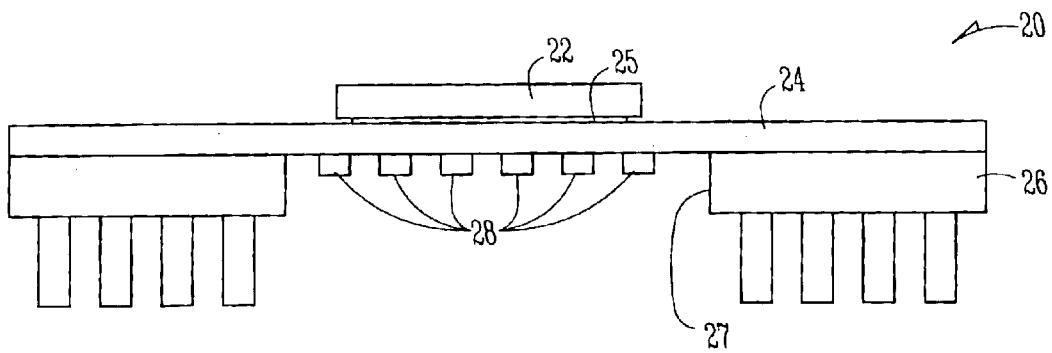
FIG. 2 is a simplified diagram similar to FIG. 1 illustrating another prior art package having a pin carrier with a cavity.
Figure 3:
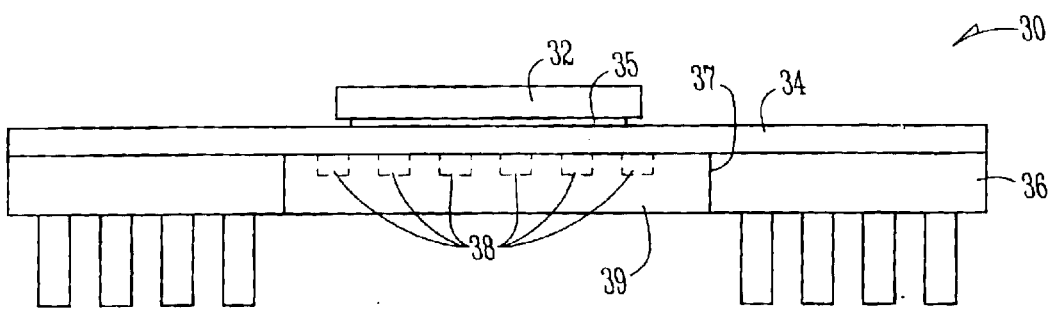
FIG. 3 is a simplified diagram similar to FIGS. 1 and 2 illustrating an electronics package of the present invention.

The present invention provides a solution to thickness, weight, and/or rigidity limitations in an electronic package, and to loop induction problems that are associated with prior art electronic packages. FIG. 3 shows an electronic package 30 of the present invention that overcomes the inductive path problem yet still has sufficient mechanical integrity. The package 30 includes a die 32 mounted onto an interposer 34. The die 32 may be any type of IC, such as a processor, memory chip, chipset component, or the like. The die 32 is mounted to the interposer 34 using a conventional C4 joint that is supplemented by a common underfill 35. A pin carrier 36 is mounted to the underside of the interposer 34. The pin carrier 36 includes a cavity 37 positioned underneath the die 32. The cavity 37 allows capacitors 38, or some other electronic component, to be mounted to the underside of the interposer 34 opposite to the die 32 using conventional surface mount technology. The cavity 37 in the pin carrier 36 is filled with an encapsulant 39 to mechanically support the thin interposer 34 in the area of the cavity 37.

The thin interposer 34 reduces the distance between the die 32 and the capacitors 38 in order to minimize the inductive loop within the package 30. The encapsulant 39 supports the thin interposer 34 in the area of the cavity 37 such that the package 30 is capable of withstanding the mechanical load that is applied to the package 30 by heat sinks and other thermal elements within the electronic assembly where the package 30 is located. The encapsulant 39 is preferably an epoxy that bonds with the pin carrier 36 when the epoxy is cured to a rigid state.

The mechanical support provided by the encapsulant 39 within the package 30 minimizes package deflection during operation of a corresponding electronic system that includes the package 30. Minimizing package deflection results in less damage to the package circuitry and/or the capacitor 38 joints and is therefore a key component in meeting reliability requirements in electronic packages with thin interposers. In addition, the epoxy encapsulant 39 and pin carrier 36 combination provide mechanical support while not limiting the ability to place electronic components, such as capacitors 38, on the underside of the thin interposer 34 opposite to the die 32.

The interposer 34 may be formed in one or more layers and be made of metal and/or an organic material. The interposer 34 may also be formed in a thin, flexible, electrically insulating or conducting tape or film that are made from materials such as polyester, polyparabanic acid, epoxy, and fiberglass. The interposer 34 may also include a plurality of conductive traces that are formed using any suitable conductive material, such as copper, aluminum, silver, or the like. The interposer 34 preferably has a thickness of less than 1 mm. However, in other embodiments, a thicker or thinner interposer 34 may be used depending on what material the interposer 34 is made from. The interposer 34 is preferably secured to the pin carrier 36 via a ball grid array (BGA) of solder balls, although any joining technique that facilitates fabricating the package 30 may be used.

In alternative forms of the invention, the pin carrier 36 may be a printed circuit board (PCB) or card, a motherboard, or any other type of packaging element. The pin carrier 36 may be multi-layered or single-layered. The present invention is not to be construed as limited to any particular type of pin carrier or to any particular method of coupling the pin carrier 36 to the interposer 34. As used herein, pin carrier refers to pin or ball-type carriers.

The cavity 37 in the pin carrier 36 includes an inner perimeter and the die 32 includes an outer perimeter. The perimeter of the die 32 is preferably smaller than the perimeter of the cavity while being substantially aligned with perimeter of the cavity 37.

While an embodiment of the package 30 is shown in which the pin carrier 36 is positioned around the periphery of the die 32, the invention applies equally to embodiments where the cavity 37 is positioned anywhere opposite to the die 32. The invention has been described such that a die 32 is mounted on the interposer 34. However, the die 32 could also be a passive component such as a resistor, capacitor, or inductor, or any other type of electronic component, whether or not implemented as an IC, such as an oscillator, filter, sensor, variable resistor, fuse, coil, or the like.

The present invention also relates to a method of fabricating an electronics package 30. The method includes securing a die 32 to one side of an interposer 34 and securing a pin carrier 36 to an opposing side of the interposer 34. The pin carrier 36 includes a cavity 37 that is positioned against the interposer 24 opposite to the die 32 such that capacitors 38, or some other type of electronic component, are secured to the interposer 34 within the cavity 37. The method further includes at least partially filling the cavity 37 in the pin carrier 36 with an encapsulant 39 to provide mechanical support to the interposer 34 during operation of the electronics package 30.

The pin carrier 36 and the capacitors 38 are preferably secured to the interposer 34 substantially simultaneously to decrease manufacturing costs. In addition, securing the die 32 the interposer 34 preferably includes forming a C4 joint between the die 32 and interposer 34 and underfilling the C4 joint with an epoxy. At least partially filling the cavity 37 in the pin carrier 36 with an encapsulant 39 may further include bonding the encapsulant 39 with the pin carrier 36 depending on the types of materials that are used for the encapsulant 39 and the pin carrier 36.

The operations discussed above with respect to the described methods may be performed in a different order from those described herein. Also, it will be understood that the method of the present invention may be performed continuously.

Figure 4:
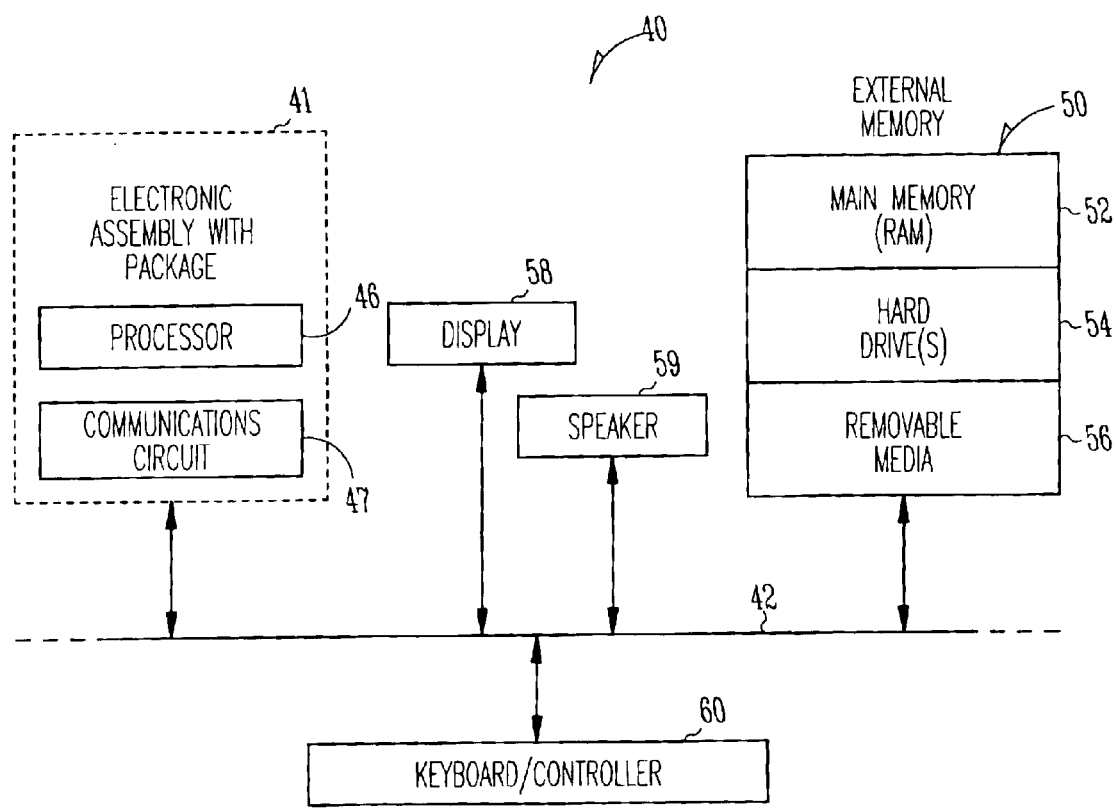
FIG. 4 is a block diagram of an electronic system incorporating at least one electronic assembly with an electronic package in accordance with the present invention.

FIG. 4 is a block diagram of an electronic system 40 incorporating at least one electronic assembly 41 that includes an electronic package, such as electronic package 30 shown in FIG. 3. The electronic package in the electronic assembly 41 has minimal inductance loop yet maintains sufficient mechanical integrity.

The illustrated electronic system 40 is merely one example of an electronic system in which the electronic package of the present invention may be used. The electronic system 40 comprises a data processing system that includes a system bus 42 which electrically couples the various components of the electronic system 40 together. The system bus 42 may be a single bus or any combination of busses.

The electronic assembly 41 is coupled to the system bus 42 and may include any circuit or combination of circuits. In one embodiment, the electronic assembly 41 includes a processor 46 which can be of any type. As used herein, processor means any type of computational circuit such as, but not limited to, a microprocessor, a microcontroller, a graphics processor, a digital signal processor (DSP), or any other type of processor or processing circuit.

Other types of circuits that can be included in electronic assembly 41 are a custom circuit, an application-specific integrated circuit (ASIC), or the like, such as, for example, one or more circuits (such as a communications circuit 47) for use in wireless devices such as cellular telephones, pagers, portable computers, two-way radios, and similar electronic systems.

The electronic system 40 may also include an external memory 50, which in turn may include one or more memory elements suitable to the particular application, such as a main memory 52 in the form of random access memory (RAM), one or more hard drives 54, and/or one or more drives that handle removable media 56 such as floppy diskettes, compact disks (CDs), digital video disk (DVD), and the like.

The electronic system 40 may also include a display device 58, a speaker 59, and a keyboard and/or controller 60 such as a mouse, trackball, game controller, microphone, voice-recognition device, or any other device that permits a system user to input information into and receive information from the electronic system 40.

As shown herein, the present invention can be implemented in a number of different embodiments, including an electronic package, an electronic system, a data processing system, one or more methods of fabricating an electronic package, and one or more methods of fabricating an electronic assembly that includes the package. Other embodiments will be readily apparent to those of ordinary skill in the art. The elements, materials, geometries, dimensions, and sequence of operations can all be varied to suit particular packaging requirements.

FIGS. 1–4 are merely representational and are not drawn to scale. Certain proportions thereof may be exaggerated, while others may be minimized. FIGS. 3 and 4 illustrate various implementations of the invention that can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An electronic package comprising:
   an interposer having an upper surface and a lower surface, the interposer being a tape having a thickness less than 1 mm;
   a die secured to the upper surface of the interposer;
   a pin carrier having a cavity, the pin carrier being secured to the lower surface of the interposer such that the cavity is adjacent, the interposer opposite to the die;
   an electronic component secured to the lower surface of the interposer, the electronic component being positioned within the cavity in the pin carrier; and
   an encapsulant substantially filling the cavity while substantially not overflowing the cavity, the encapsulant supporting the interposer such that the interposer is capable of withstanding a mechanical load generated by thermal elements and is incapable of withstanding the mechanical load without the encapsulant.

2. The electronic package of claim 1, wherein the interposer is a composite metal and organic material.

3. The electronic package of claim 1, wherein the electronic component is a capacitor and the interposer is thin enough to minimize the inductive loop between the capacitor and the die.

4. The electronic package of claim 1, wherein the encapsulant is an epoxy.

5. The electronic package of claim 1, wherein the pin carrier is attached to the interposer using a ball grid array of solder balls.

6. The electronic package of claim 1, wherein the cavity in the pin carrier includes a perimeter and the die includes a perimeter substantially aligned with the perimeter of the cavity.

7. The electronic package of claim 1, wherein the cavity in the pin carrier includes a perimeter and the die includes a perimeter that is smaller than the perimeter of the cavity.

8. A data processing system comprising:
   a bus;
   a memory coupled to the bus;
   a processor; and
   an electronic package including an interposer that is a tape having a thickness less than 1 mm, a pin carrier and an electronic component, the processor being secured to one side of the interposer and the pin carrier being secured to other side of the interposer, the pin carrier electrically connecting the processor to the bus and including a cavity that is adjacent the interposer opposite to the processor, the electronic component being secured to the interposer within the cavity in the pin carrier, and the package further including an encapsulant that at least substantially fills the cavity in the pin carrier while substantially not overflowing the cavity, the encapsulant supporting the interposer such that the interposer is capable of withstanding a mechanical load generated by thermal elements and is incapable of withstanding the mechanical load without the encapsulant.

9. The data processing system of claim 8, wherein the electronic component is a capacitor.

10. The data processing system of claim 9, wherein the interposer is thin enough to minimize the inductive loop between the capacitor and the die.

11. An electronic package comprising:
    an interposer, the interposer being a tape having a thickness less than 1 mm;
    a die secured to the interposer;
    a pin carrier secured to the interposer, the pin carrier including a cavity opposite to the die;
    an electronic component secured to the interposer within the cavity; and
    an encapsulant substantially filling the cavity while substantially not overflowing the cavity, the encapsulant supporting the interposer such that the interposer is capable of withstanding a mechanical load generated by thermal elements and is incapable of withstanding the mechanical load without the encapsulant.

12. The electronic package of claim 11, wherein the interposer the electronic component is a capacitor and the interposer is thin enough to minimize inductive loop between the capacitor and the die.

13. The electronic package of claim 11, where in the encapsulant is an epoxy.

* * * * *